United States Patent
Dunklee et al.

(10) Patent No.: US 10,295,565 B2
(45) Date of Patent: May 21, 2019

(54) PROBE CARD WITH STRESS RELIEVING FEATURE

(71) Applicant: CELADON SYSTEMS, INC., Burnsville, MN (US)

(72) Inventors: John L. Dunklee, Tigard, OR (US); William A. Funk, Lakeville, MN (US)

(73) Assignee: CELADON SYSTEMS, INC., Burnsville, MN (US)

( * ) Notice: Subject to any disclaimer, the term of this patent is extended or adjusted under 35 U.S.C. 154(b) by 0 days.

(21) Appl. No.: 15/512,249

(22) PCT Filed: Sep. 18, 2015

(86) PCT No.: PCT/US2015/051052
§ 371 (c)(1),
(2) Date: Mar. 17, 2017

(87) PCT Pub. No.: WO2016/044786
PCT Pub. Date: Mar. 24, 2016

(65) Prior Publication Data
US 2017/0285069 A1    Oct. 5, 2017

Related U.S. Application Data

(60) Provisional application No. 62/052,912, filed on Sep. 19, 2014.

(51) Int. Cl.
*G01R 1/073* (2006.01)
*G01R 1/04* (2006.01)
(Continued)

(52) U.S. Cl.
CPC ....... *G01R 1/07342* (2013.01); *G01R 1/0491* (2013.01); *G01R 1/06705* (2013.01);
(Continued)

(58) Field of Classification Search
CPC .............. G01R 1/07342; G01R 1/0491; G01R 1/06705; G01R 1/07307; G01R 1/07314
See application file for complete search history.

(56) References Cited

U.S. PATENT DOCUMENTS 5,517,126 A    5/1996  Yamaguchi
5,521,523 A    5/1996  Kimura et al.
(Continued)

FOREIGN PATENT DOCUMENTS

CN         1957259 A      5/2007
CN       101002311 A      7/2007
(Continued)

OTHER PUBLICATIONS

International Search Report and Written Opinion for international application No. PCT/US2015/051052, dated Jan. 11, 2016 (10 pages).

*Primary Examiner* — Walter L Lindsay, Jr.
*Assistant Examiner* — Milton Gonzalez
(74) *Attorney, Agent, or Firm* — Hamre, Schumann, Mueller & Larson, P.C.

(57) ABSTRACT

A probe card assembly is disclosed. The probe card assembly includes a probe card plate, a probe core, and an expansion gap defined in the probe card plate. The probe core includes a bonding portion for fixing the probe core to the probe plate. The expansion gap surrounds the probe core. Another probe card assembly is disclosed. The another probe card assembly includes a probe card plate, a tube, and a probe core. The tube is configured to be inserted into an opening of the probe card plate and configured to be securely fixed to the probe card plate. The probe core includes a bonding portion for fixing the probe core to the tube.

11 Claims, 4 Drawing Sheets

(51) Int. Cl.
   *G01R 1/067*   (2006.01)
   *G01R 31/28*   (2006.01)
(52) U.S. Cl.
   CPC ..... *G01R 1/07307* (2013.01); *G01R 1/07314* (2013.01); *G01R 31/2863* (2013.01)

(56) References Cited

U.S. PATENT DOCUMENTS

| | | |
|---|---|---|
| 6,064,215 A | 5/2000 | Kister |
| 2009/0206860 A1 | 8/2009 | McFarland et al. |
| 2010/0052711 A1 | 3/2010 | Park |
| 2014/0016123 A1* | 1/2014 | Chang .................... G01N 21/88 356/237.1 |
| 2014/0225636 A1* | 8/2014 | Root ................ G01R 31/2889 324/750.24 |

FOREIGN PATENT DOCUMENTS

| | | |
|---|---|---|
| CN | 101133338 | 2/2008 |
| CN | 101243323 A | 8/2008 |
| EP | 1744166 A1 | 1/2007 |
| TW | 201307871 A | 2/2013 |
| WO | 2006/060467 A2 | 6/2006 |
| WO | 2009/105497 A2 | 8/2009 |

\* cited by examiner

PROBE CARD WITH STRESS RELIEVING FEATURE

FIELD

This disclosure relates generally to test equipment for a device under test, such as, but not limited to, a semiconductor device. More specifically, the disclosure relates to a probe card assembly including one or more expansion gaps.

BACKGROUND

The semiconductor industry continues to have a need to access numerous electronic devices on a semiconductor wafer. As the semiconductor industry continues to grow, devices become smaller and more complex. Many electrical devices, most commonly semiconductor devices and on-wafer electrical interconnects, are electrically tested. Some of these tests require sensitive measurements, with electrical isolation between channels of the probe card on the order of $10^{10}$ to $10^{14}$ Ohms. Some types of testing (e.g., reliability testing, or the like) may generally require long measurement periods, which can be in the range of several hours to several weeks. Reliability testing also generally includes a wide range in temperatures, which can be anywhere from about ambient to about 400° C. As the semiconductor devices get smaller, so do the contacts (generally referred to as pads) used to test the devices. Relatively smaller pads, which can be in the range of about 50 µm by about 50 µm (or even smaller), requires relatively smaller probes and relatively higher precision of probe alignment.

Multisite testing is one approach for increasing test sample size without further increasing the test durations. Multisite testing relies on testing relatively more portions of the semiconductor wafer simultaneously. Multisite testing, particularly multisite testing over a wide range of temperatures (e.g., about ambient to about 400° C. as mentioned above) includes additional challenges. For example, in order for a probe card to contact multiple sites on the semiconductor wafer over a range of temperatures, the probe card generally will need to change in size by about the same amount as the semiconductor wafer and generally must remain substantially flat over the various temperatures. Mismatches in expansion or changes in flatness of the probe card can cause positioning errors between the probes and the semiconductor wafer pads.

Probe cards are often constructed of a variety of materials, such as, but not limited to, metal alloys or the like for a probe card plate and ceramics or the like for a probe core. The materials are generally selected based on the low thermal expansion of silicon and ceramics in order to provide relatively high electrical isolation. The materials, however, generally have different coefficients of thermal expansion, which can cause a buildup of stress between the components, and can even cause shifting between the components. Unless the probe sites are adjustable, which is generally not the case due to the amount of time, limited access, and complexity involved, shifting is problematic as it affects the alignment between the probes and the semiconductor wafer pads. As a result, the components of the probe card assembly are generally bonded together. Bonding the components together can lead to deformation, and even fracture, of the components or the bonds between them when testing across a large temperature range.

SUMMARY

This disclosure relates generally to test equipment for a device under test, such as, but not limited to, a semiconductor device. More specifically, the disclosure relates to a probe card assembly including one or more expansion gaps.

In some embodiments, a probe card assembly includes a probe card plate and a probe core bonded to at least a portion of the probe card plate. In some embodiments, an expansion gap can be formed in the probe card plate around the probe core. In some embodiments, a probe card plate having an expansion gap formed therein can reduce compressive stresses transferred from the probe core to the probe card plate under varying temperatures.

A probe card assembly is disclosed. The probe card assembly includes a probe card plate, a probe core, and an expansion gap defined in the probe card plate. The probe core includes a bonding portion for fixing the probe core to the probe plate. The expansion gap surrounds the probe core.

In some embodiments, a probe card assembly includes a probe card plate and a tube bonded to at least a portion of the probe card plate. In such embodiments, a probe core can be bonded to the tube. An expansion gap may be maintained between the tube and the probe card plate.

Another probe card assembly is disclosed. The another probe card assembly includes a probe card plate, a tube, and a probe core. The tube is configured to be inserted into an opening of the probe card plate and configured to be securely fixed to the probe card plate. The probe core includes a bonding portion for fixing the probe core to the tube.

BRIEF DESCRIPTION OF THE DRAWINGS

References are made to the accompanying drawings that form a part of this disclosure, and which illustrate embodiments in which the systems and methods described in this specification can be practiced.

Like reference numbers represent like parts throughout.

DETAILED DESCRIPTION

This disclosure relates generally to test equipment for a device under test, such as, but not limited to, a semiconductor device. More specifically, the disclosure relates to a probe card assembly including one or more expansion gaps.

Test equipment for a device under test, such as, but not limited to, a device under test, can be subject to a wide range of testing conditions. For example, the testing conditions can include a range of temperatures from about ambient to about 400 degrees Fahrenheit. In some embodiments, cryogenic testing applications can also be subject to temperatures ranging below about 0 degrees Fahrenheit. When subject to such temperature variations, the test equipment (e.g., a probe card assembly) may deform due to compressive stresses caused by components of the probe card assembly being made of different materials. Deformation of the probe card plate can affect the alignment of the probe card assembly with the device under test, especially deformation with respect to a plane that is parallel to the probe card plate.

In some embodiments, a probe card assembly, as described herein, can include a probe card plate, a probe core, and one or more expansion gaps maintained between the probe card plate and the probe core. In some embodiments, the one or more expansion gaps can reduce deformation of the probe card plate in a direction of a plane that is parallel to the probe card plate.

Figure 1:
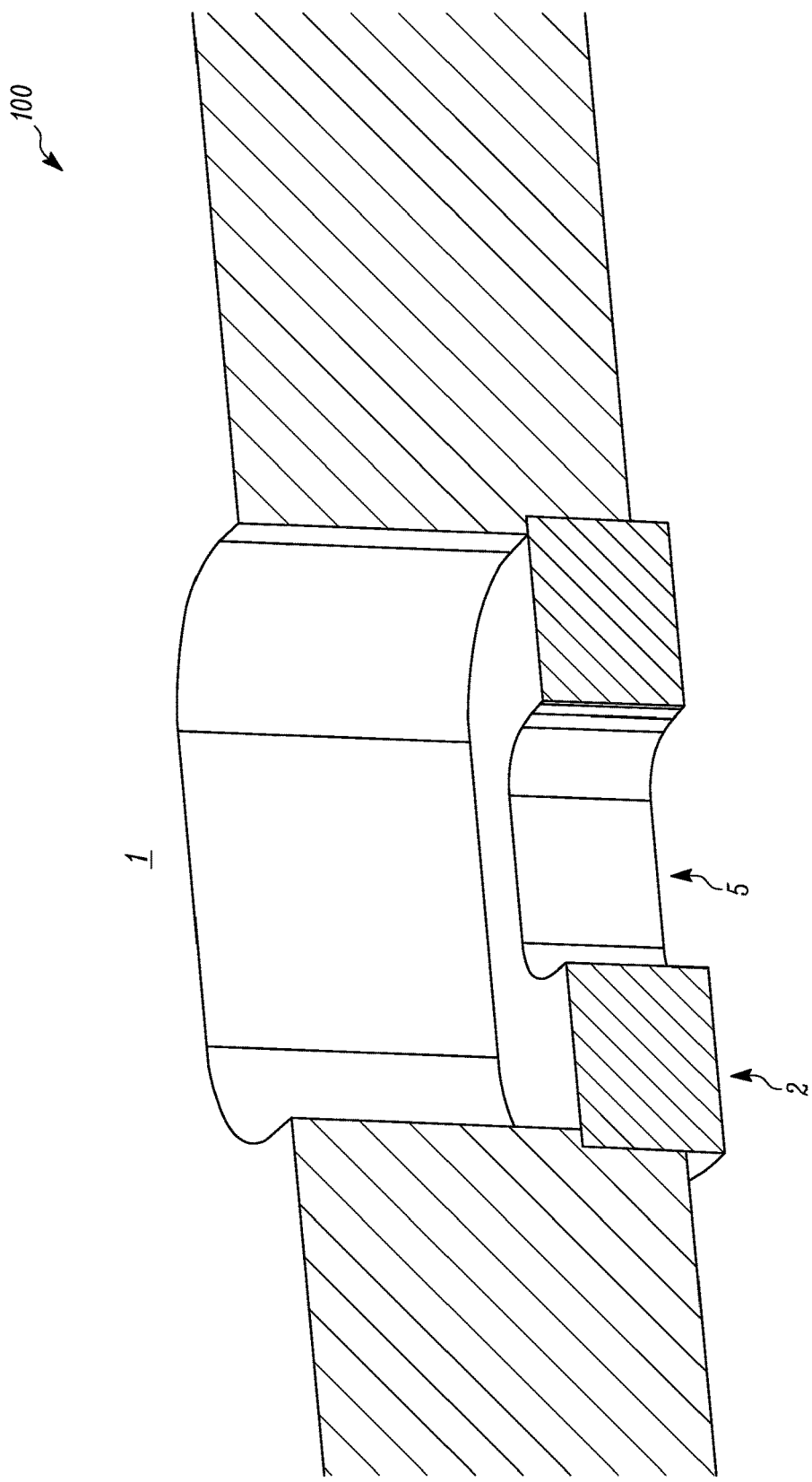
FIG. 1 illustrates a prior art probe card assembly.

FIG. 1 illustrates a cross-section of a portion of a prior art probe card assembly 100. The probe card assembly 100 includes a probe card plate 1 and a probe core 5. It is to be appreciated that the probe core 5 includes a plurality of probes (e.g., about 1-about 100 or more), which are not shown for simplicity of this specification. The probe core 5 includes a bonding portion 2 which overlaps with the probe card plate 1. The bonding portion 2 provides a surface of the probe core 5 which can be securely fixed to the probe card plate 1. The probe card plate 1 can include a plurality of probe cores 5 for testing at a plurality of locations with a single probe card assembly. The probe card plate 1 can be made of, for example, a metal, a metal alloy, or the like. The probe core 5 is generally made of a ceramic material. The ceramic material of the probe core 5 generally has a higher coefficient of thermal expansion than the metal alloy of the probe card plate 1. As a result, the probe card plate 1 can be subjected to compressive stresses as the probe card assembly increases in temperature. The compressive stresses are generally below the compressive yield strength of the ceramic and the adhesive, thus the probe core 5 and bond to the probe card plate 1 are generally not fractured. However, the compressive stresses can cause the probe card plate 1 to deform (e.g., bow or warp). Deformation of the probe card plate 1 can be particularly problematic as it can cause misalignment of the one or more probes and the semiconductor pads on a wafer to be tested. Misalignment can lead to incorrect test results, or even require replacement of the warped probe card assembly, which can increase the cost associated with testing. Further, misalignment caused during a test can lead to faulty test results, requiring the test to be redone. Due to the duration of some testing, this can lead to significant amounts of time lost.

Figure 2:
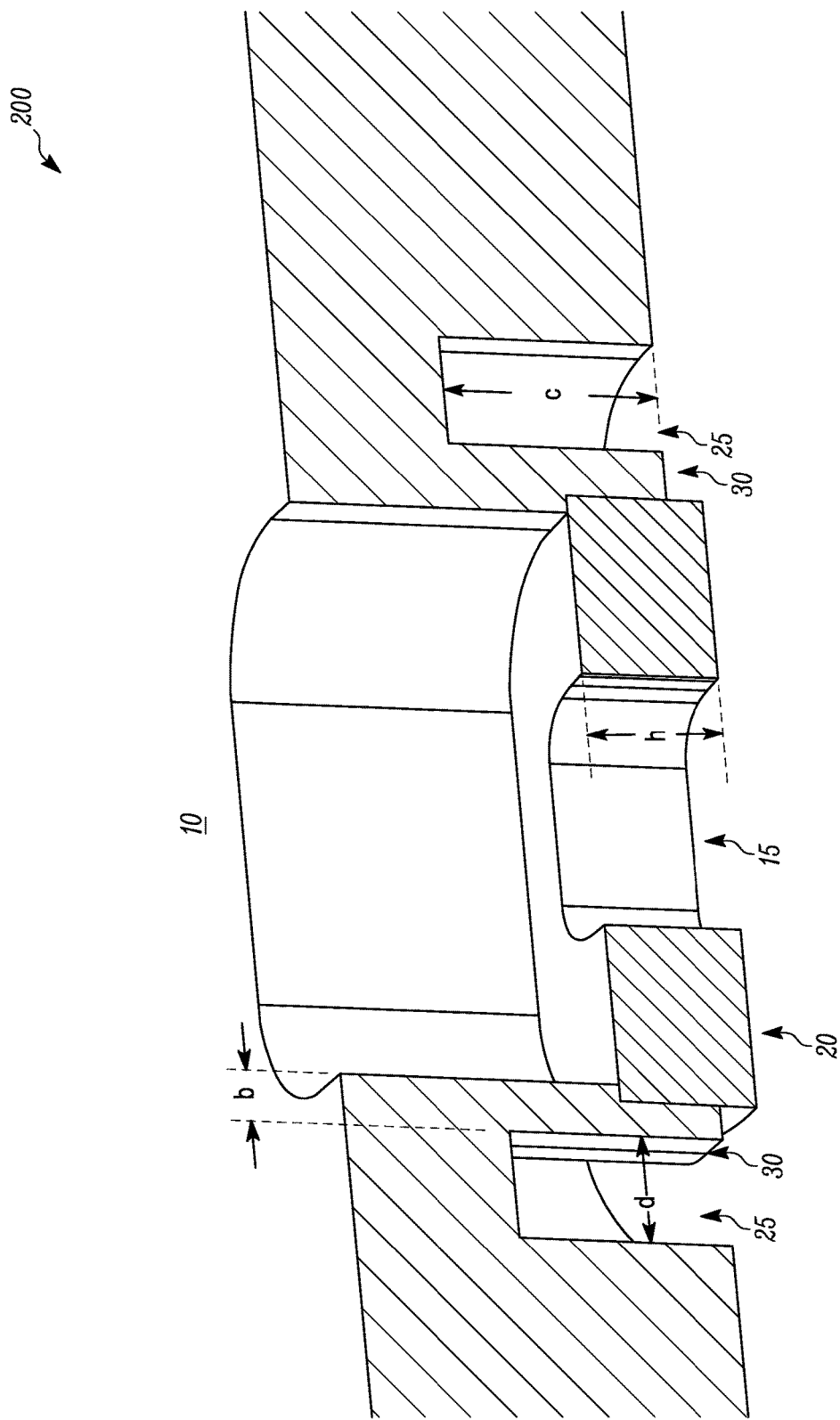
FIG. 2 illustrates probe card assembly having a stress-relieving expansion gap, according to some embodiments.

FIG. 2 illustrates a cross-section of a portion of a probe card assembly 200, according to some embodiments. Aspects of the probe card assembly 200 can be the same as or similar to aspects of the probe card assembly 100 of FIG. 1. The probe card assembly 200 generally includes a probe card plate 10 and a probe core 15 along with a bonding portion 20. In some embodiments, aspects of the probe card plate 10 can be the same as or similar to the probe card plate 1, aspects of the probe core 15 can be the same as or similar to aspects of the probe core 5, and aspects of the bonding portion 20 can be the same as or similar to aspects of the bonding portion 2.

The probe card assembly 200 further includes an expansion gap 25 defined in the probe card plate 10. The expansion gap 25 is formed in a portion of the probe card plate 10 and extends around the probe core 15. The expansion gap 25 is formed a distance b away from the opening in which the probe core 15 is located. The distance b also corresponds to a thickness of a portion 30 of the probe card plate 10 to which the probe core 15 is fixed. The probe core 15 can be fixed to the portion 30 according to methods known in the art such as, but not limited to, with adhesives.

The expansion gap 25 can have a depth c and a width d. The depth c and the width d can be varied. In some embodiments, the depth c can be equal to or about equal to the height h of the probe core 15. In some embodiments, the depth c can be greater than the height h of the probe core 15. In such embodiments, the compressive stresses to the probe card plate 10 caused by the probe core 15 can be reduced as compared to the compressive stresses in the known probe card assembly 100 (FIG. 1). In some embodiments, the distance b can be varied such that the amount of material forming the portion 30 is not constant around the perimeter of the probe core 15. For example, the portion 30 can be configured such that the distance b is greater where the bonding portion 20 overlaps the probe card plate 10 than the distance b where the bonding portion 20 does not overlap the probe card plate 10. Due to the reduction in the transfer of compressive stresses, the probe card plate 10 can remain substantially flat over the variety of temperatures required during test performance. In some embodiments, the configuration (e.g., sizing, shape, uniformity, or the like) of the expansion gap 25 can be selected based on the testing application. For example, the expansion gap 25 can be configured based on the materials of the probe card plate 10 and the probe core 15. Similarly, the expansion gap 25 can be configured based on a temperature range at which the testing will be performed (which may also be dependent upon the materials for the probe card plate 10 and the probe core 15). It is to be appreciated that suitable combinations of the foregoing can be used to select the configuration for the expansion gap.

It is to be appreciated that for a multisite testing application, the probe card plate 10 can include a plurality of the probe cores 15 (not shown). In such embodiments, the expansion gap 25 formed in a portion of the probe card plate 10 and extending around the probe core 15 can overlap with expansion gaps 25 extending around the plurality of probe cores 15.

In some embodiments, the addition of the expansion gap 25 can cause the probe card plate 10 to remain flat within about 5 µm to about 10 µm of deflection for a probe card plate 10 having a diameter of about 300 mm. It is to be appreciated that these numbers are intended to be exemplary and are not intended to limit the geometry of the probe card plate 10.

Figure 3:
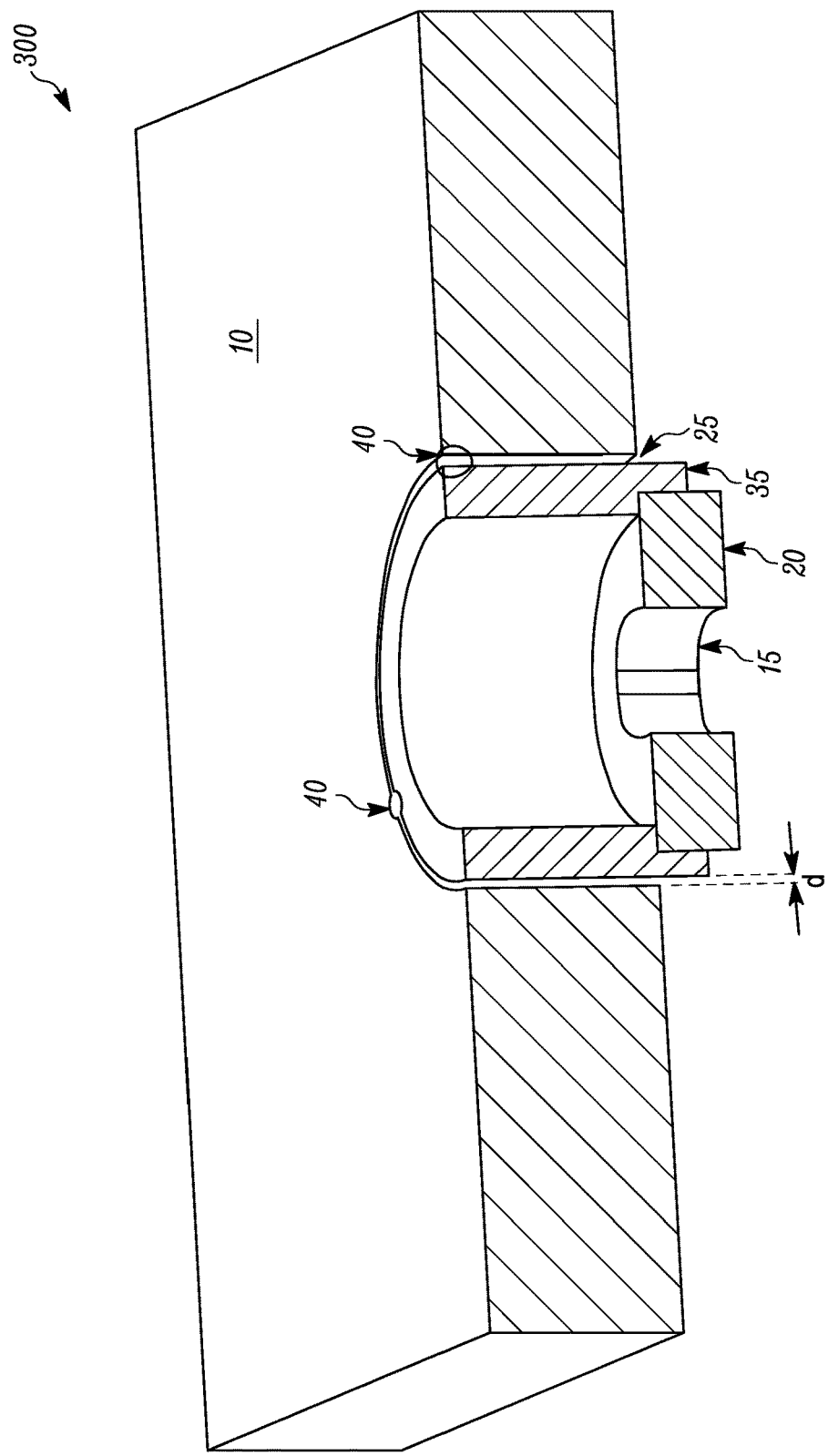
FIG. 3 illustrates a probe card assembly including a tube, according to some embodiments.

FIG. 3 illustrates a cross-section of a portion of a probe card assembly 300, according to some embodiments. Aspects of the probe card assembly 300 can be the same as or similar to aspects of the probe card assembly 100 of FIG. 1 and/or the probe card assembly 200 of FIG. 2. The probe card assembly 300 generally includes the probe card plate 10 and the probe core 15 along with the bonding portion 20.

The probe card assembly 300 further includes a tube 35. The probe core 15 is fixed (e.g., using similar means as described with reference to FIG. 2 above) to the tube 35. The tube 35 can be made of the same material as the probe card plate 10, according to some embodiments. Alternatively, the tube 35 can be made of a different material than the probe card plate 10, according to some embodiments.

The tube 35 is fixed to the probe card plate 10 such that the expansion gap 25 is maintained between the tube 35 and the probe card plate 10. Similar to the probe card assembly 200, the expansion gap 25 has a width d which corresponds to a distance between a surface of the probe card plate 10 and a surface of the tube 35 that is adjacent to the probe card plate 10. In some embodiments, the width d of the expansion gap 25 may correspond to a thickness of one or more welds 40 which fix the tube 35 to the probe card plate 10. In embodiments in which the tube 35 is made of a different material than the probe card plate 10, the tube 35 may be welded in as few places as are required to securely fix the tube 35 to the probe card plate 10. In embodiments in which the tube 35 is made of the same material as the probe card plate 10, the tube 35 may be welded in relatively more places than when the tube 35 and the probe card plate 10 are made of different materials. By maintaining the expansion gap 25 between the tube 35 and the probe card plate 10, the compressive stresses caused by temperature fluctuations can be focused to the tube 35, and the compressive stresses to the probe card plate 10 can be reduced as compared to the prior art probe card assembly 100 of FIG. 1.

In some embodiments, the welds 40 can generally be placed at an "upper" surface of the probe card plate 10 that faces away from the device under test. In some embodiments, the welds 40 being placed at this upper surface of the probe card plate 10 can allow the tube 35 to deform under the compressive stresses caused by the temperature ranges while reducing the compressive stress that is transferred to the welds 40 and, therefore, the probe card plate 10. In some embodiments, the welds 40 being disposed at the upper surface may also, for example, simplify a manufacturing process for making the probe card assembly 300. In some embodiments, the welds 40 can be placed at a location that is between the upper surface of the probe card plate 10 and the upper surface of the probe core 15. In some embodiments, the tube 35 can also include welds 40 disposed between the upper surface of the probe core 15 and the lower surface of the probe core 15.

Figure 4:
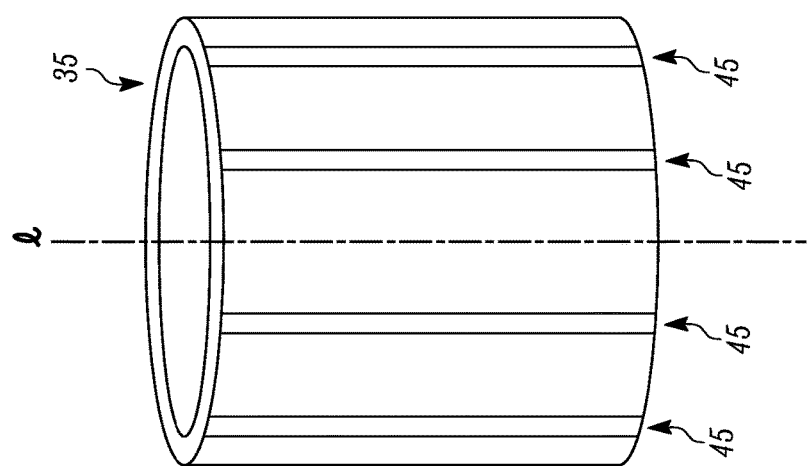
FIG. 4 illustrates a tube including one or more expansion gaps, according to some embodiments.

In some embodiments, one or more expansion gaps running parallel to a longitudinal axis of the tube can be formed along an outer surface of the tube 35 (as shown in FIG. 4). The one or more expansion gaps can allow for further deformation of the tube 35 while reducing the compressive stresses transferred to the probe card plate 10 via the welds 40.

FIG. 4 illustrates the tube 35 including one or more tube expansion gaps 45, according to some embodiments. The tube 35 of FIG. 4 can be included in the probe card assembly 300 of FIG. 3. It is to be appreciated that the number of expansion gaps 45 can be varied. The depth of the expansion gaps 45 into the cylinder can be varied. In some embodiments, the expansion gaps 45 can have a varying depth along the length of the expansion gap 45. In some embodiments, the one or more expansion gaps 45 can be uniform in size, shape, etc. In other embodiments, the one or more expansion gaps 45 can be different in size, shape, etc.

The expansion gaps 45 in the tube 35 generally extend in a direction that is substantially parallel to a longitudinal axis 1 of the tube.

Aspects

It is to be appreciated that any of aspects 1-6 can be combined with any of aspects 7-14.

Aspect 1. A probe card assembly, comprising:
a probe card plate;
a probe core, wherein the probe core includes a bonding portion for fixing the probe core to the probe plate; and
an expansion gap defined in the probe card plate, wherein the expansion gap surrounds the probe core.

Aspect 2. The probe card assembly according to aspect 1, wherein the probe card plate and the probe core are made of different materials having different thermal expansion properties.

Aspect 3. The probe card assembly according to any of aspects 1-2, wherein the expansion gap has a depth that is greater than or equal to a height of the probe core.

Aspect 4. The probe card assembly according to any of aspects 1-3, further comprising one or more additional probe cores, each of the one or more additional probe cores including a corresponding expansion gap.

Aspect 5. The probe card assembly according to any of aspects 1-4, wherein the probe bonding portion of the probe core overlaps with at least a portion of the probe card plate.

Aspect 6. The probe card assembly according to any of aspects 1-5, wherein the expansion gap has a variable width.

Aspect 7. A probe card assembly, comprising:
a probe card plate;
a tube, the tube configured to be inserted into an opening of the probe card plate and configured to be securely fixed to the probe card plate; and
a probe core, wherein the probe core includes a bonding portion for fixing the probe core to the tube.

Aspect 8. The probe card assembly according to aspect 7, wherein the tube is securely fixed to the probe card plate such that a gap is maintained between a surface of the tube and a surface of the probe card plate.

Aspect 9. The probe card assembly according to any of aspects 7-8, wherein the tube is welded to the probe card plate.

Aspect 10. The probe card assembly according to any of aspects 7-9, wherein the tube is made of a different material than the probe card plate.

Aspect 11. The probe card assembly according to any of aspects 7-10, wherein the bonding portion of the probe core overlaps with at least a portion of the tube.

Aspect 12. The probe card assembly according to any of aspects 7-11, wherein the tube and the probe core are made of different materials having different thermal expansion properties.

Aspect 13. The probe card assembly according to any of aspects 7-12, further comprising one or more additional probe cores, each of the one or more additional probe cores including a corresponding tube for fixing the one or more additional probe cores to the probe card plate.

Aspect 14. The probe card assembly according to any of aspects 7-13, wherein the tube includes one or more expansion gaps formed in a surface of the tube adjacent to the probe card plate and extending in a direction substantially parallel to a longitudinal axis of the tube.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

The following terms have been particularly described throughout the description and are not intended to be limitative:

Semiconductor Device Not Limitative

The present disclosure is particularly suitable for probing semiconductor devices, but the use of the present teachings is not limited to probing semiconductor devices. Other devices may be applied to the present invention teachings. Thus, while this specification speaks in terms of probing "semiconductor" devices, this term should be interpreted broadly to include probing any suitable device.

What is claimed is:

1. A probe card assembly, comprising:
a probe card plate;
a probe core, wherein the probe core includes a bonding portion for fixing the probe core to the probe card plate; and
an expansion gap defined in the probe card plate, wherein the expansion gap extends around and surrounds the probe core.

2. The probe card assembly according to claim 1, wherein the probe card plate and the probe core are made of different materials having different thermal expansion properties.

3. The probe card assembly according to claim 1, wherein the expansion gap has a depth that is greater than or equal to a height of the probe core.

4. The probe card assembly according to claim 1, wherein the bonding portion of the probe core overlaps with at least a portion of the probe card plate.

5. The probe card assembly according to claim 1, wherein the expansion gap has a variable width in an unexpanded state.

6. A probe card assembly, comprising:
a probe card plate;
a tube, the tube configured to be inserted into an opening of the probe card plate and configured to be securely fixed to the probe card plate, wherein the tube includes one or more expansion gaps formed in a surface of the tube adjacent to the probe card plate and extending in a direction substantially parallel to a longitudinal axis of the tube from a first end of the tube to a second end of the tube; and
a probe core, wherein the probe core includes a bonding portion for fixing the probe core to the tube.

7. The probe card assembly according to claim 6, wherein the tube is securely fixed to the probe card plate such that a gap is maintained between a surface of the tube and a surface of the probe card plate.

8. The probe card assembly according to claim 6, wherein the tube is welded to the probe card plate.

9. The probe card assembly according to claim 6, wherein the tube is made of a different material than the probe card plate.

10. The probe card assembly according to claim 6, wherein the bonding portion of the probe core overlaps with at least a portion of the tube.

11. The probe card assembly according to claim 6, wherein the tube and the probe core are made of different materials having different thermal expansion properties.

* * * * *